United States Patent
Tangudu et al.

(10) Patent No.: US 10,581,406 B2
(45) Date of Patent: Mar. 3, 2020

(54) DIGITAL FILTERING FOR ANALOG GAIN/PHASE ERRORS

(71) Applicant: TEXAS INSTRUMENTS INCORPORATED, Dallas, TX (US)

(72) Inventors: Jawaharlal Tangudu, Bangalore (IN); Karthik Khanna S, Chennai (IN); Chandrasekhar Sriram, Chennai (IN); Rajendrakumar Joish, Bangalore (IN); Viswanathan Nagarajan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/005,673

(22) Filed: Jun. 11, 2018

(65) Prior Publication Data

US 2019/0013795 A1    Jan. 10, 2019

(30) Foreign Application Priority Data

Jun. 9, 2017   (IN) .............................. 201741020240

(51) Int. Cl.
| | |
|---|---|
| *H03H 11/12* | (2006.01) |
| *H01P 1/22* | (2006.01) |
| *H03H 11/06* | (2006.01) |
| *H03H 11/04* | (2006.01) |
| *H03M 1/12* | (2006.01) |

(52) U.S. Cl.
CPC ........... *H03H 11/1204* (2013.01); *H01P 1/22* (2013.01); *H03H 11/06* (2013.01); *H03H 2011/0494* (2013.01); *H03M 1/12* (2013.01)

(58) Field of Classification Search
CPC .... H03H 11/1204; H03H 11/06; H03H 17/02; H03H 2011/0494; H03H 1/12; H01P 1/22
USPC ....................................................... 455/190.1
See application file for complete search history.

(56) References Cited

U.S. PATENT DOCUMENTS

| | | | |
|---|---|---|---|
| 6,483,883 B1 * | 11/2002 | Iemura ................ | H04L 27/3809 370/204 |
| 8,614,603 B1 * | 12/2013 | Wyse ..................... | H03F 3/211 330/253 |

\* cited by examiner

*Primary Examiner* — Lee Nguyen

(74) *Attorney, Agent, or Firm* — John R. Pessetto; Charles A. Brill; Frank D. Cimino

(57) ABSTRACT

A circuit for digital filtering an analog signal converted to digital, including an analog circuit to generate an analog signal, the analog signal including phase and/or gain errors. An analog-to-digital converter (ADC) to convert the analog signal to a digital signal output to a digital signal path. A frequency-dependent corrector filter included in the digital signal path, and configured as a parameterized filter, the parameterized filter configurable based on the DSA control signal with at least one complex filter parameter for each DSA attenuation step, to correct frequency-dependent errors in phase and/or gain.

20 Claims, 7 Drawing Sheets

LOW IF

ZERO-IF

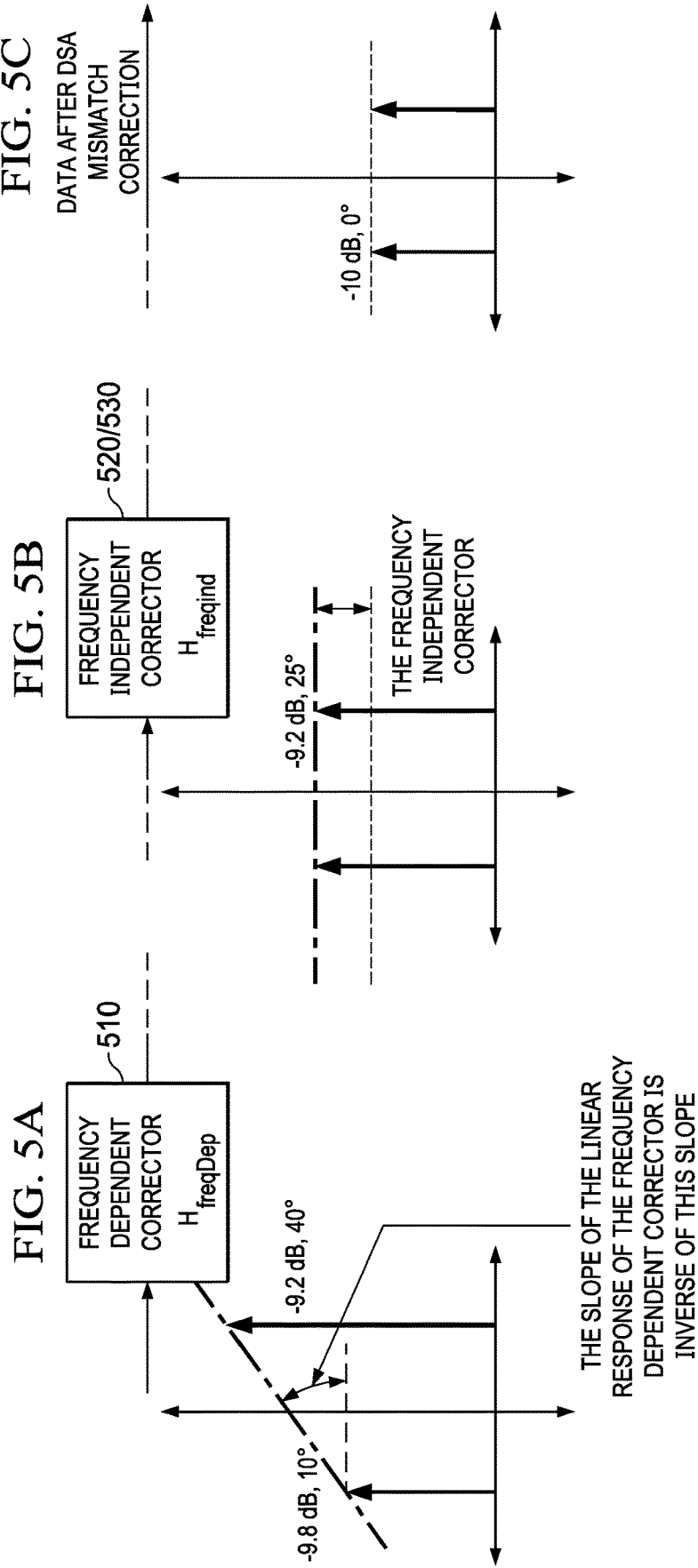

DIGITAL FILTERING FOR ANALOG GAIN/PHASE ERRORS

CROSS-REFERENCE TO RELATED APPLICATIONS

Priority is claimed under 37 CFR 1.78 and 35 USC 119(e) to IN Provisional Application 201741020240, filed 2017 Jun. 9, which is incorporated by reference in its entirety.

BACKGROUND

Digital step attenuation (DSA) can be used in the transmit (TX) and receive (RX) signal chains of a wireless (RF) communication transceiver or system to dynamically attenuate/adjust RF signal power to be within the input range specification for TX power amplification (PA), or RX conversion to digital (ADC). Gain control functionality can be used to dynamically select DSA attenuation steps, each step to provide a specified level of attenuation (in dB).

An important performance requirement for a DSA is to dynamically control attenuation without distorting the attenuated TX or RX signal input to the ADC. Particularly for wireless infrastructure applications, specifications on the accuracies of the DSA attenuation steps can be stringent.

For example, 3G/4G systems employ QAM (I/Q) constellations for encoding bits. A phase/gain error in DSA attenuation can cause a change in the constellation points, leading to errors in symbol decoding. Specifically, a gain error will lead to expansion/shrinkage of the constellation points, and a phase error will lead to rotation of the constellation points.

Within a target frequency band (band of interest), phase and gain errors can vary with frequency. One approach to compensating for phase and gain errors is to include in the post-conversion digital signal chain an N-tap complex filter can be used to correct for frequency dependent mismatches. To estimate the filter taps, a tone is swept through the target frequency band, and the estimated taps are programmed into an LUT indexed by DSA attenuation word generated by the AGC.

While this Background is directed to digital step attenuation in the context of RF communications (TX/RX), the Disclosure has general applicability to providing digital filtering for frequency-dependent errors in phase and/or gain of an analog signal.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for digital filtering for frequency-dependent errors in phase and/or gain (phase/gain) of an analog signal, using a parameterized filter with a complex filter parameter.

According to aspects of the Disclosure, a circuit for digital filtering an analog signal converted to digital, including an analog circuit to generate an analog signal, the analog signal including phase and/or gain errors. An analog-to-digital converter (ADC) to convert the analog signal to a digital signal output to a digital signal path. A frequency-dependent corrector filter included in the digital signal path, and configured as a parameterized filter, the parameterized filter configurable based on the DSA control signal with at least one complex filter parameter for each DSA attenuation step, to correct frequency-dependent errors in phase and/or gain.

Other aspects and features of the invention claimed in this Patent Document will be apparent to those skilled in the art from the following Disclosure.

BRIEF DESCRIPTION OF THE DRAWINGS

FIG. 1A illustrates the example RX signal chain, including an analog signal chain with RX input amplification 20, DSA 30 and RF ADC 50, and a digital signal chain with DDC (digital down converter) 60 and IQ (dual band) output 70; and FIG. 1B illustrates the example RX signal chain 10 of FIG. 1A, with additional functional blocks for AGC (automatic gain control) 80 to provide a DSA control word (signal) to implement an AGC algorithm for controlling DSA 30, and DGC (digital gain compensation) 72.

FIG. 3A illustrates a low-intermediate frequency (Low-IF) architecture in which the analog signal chain includes, after the DSA 30, an analog (real) mixer 40A to downconvert the input RF, and including in the digital signal chain a DDC 60 as in FIG. 2, with digital filtering 110/111 and 130/131 to correct DSA gain and phase errors; and FIG. 3B illustrates a zero-intermediate frequency (Zero-IF) architecture in which the analog signal chain includes, after the DSA 30, a complex IQ analog mixer 40B to downconvert the input RF, and including in the digital signal chain a DDC 60 without downconversion, with digital filtering 110/111 and 130/131 to correct DSA gain/phase errors.

FIGS. 5A-5C are example plots illustrating an example calibration operation for determining: (a) for the DSA frequency-dependent corrector, complex filter parameters for the parameterized filter 510, based on DSA responses to two tone signals in the target frequency band, with a slope of the DSA responses equated to the slope of the linear phase change of the parameterized, and the slope of the linear gain change of the parameterized filter over, over the target frequency band; and (b) for the DSA frequency-independent corrector 520/530, the DSA phase correction to correct frequency-independent DSA phase errors, and the DSA gain correction to correct frequency-independent DSA gain errors, are estimated based on residual frequency-independent DSA phase error and frequency-independent DSA gain error remaining after the DSA frequency-dependent corrector filter has corrected frequency-dependent phase and gain errors.

FIG. 6A illustrates an example calibration configuration for DSA RC code selection 632, including the use of weighted optimal RC code selection criteria to optimize for gaining in the DSA correctors (frequency-independent and frequency dependent), rather than attenuation, to avoid ADC saturation; and FIG. 6B illustrates an example calibration methodology in which the reference used in the calibration configuration of FIG. 6A is periodically calibrated (for example, back to 0 dB) during DSA RC code calibration 636A/636B.

DETAILED DESCRIPTION

Figure 1A:
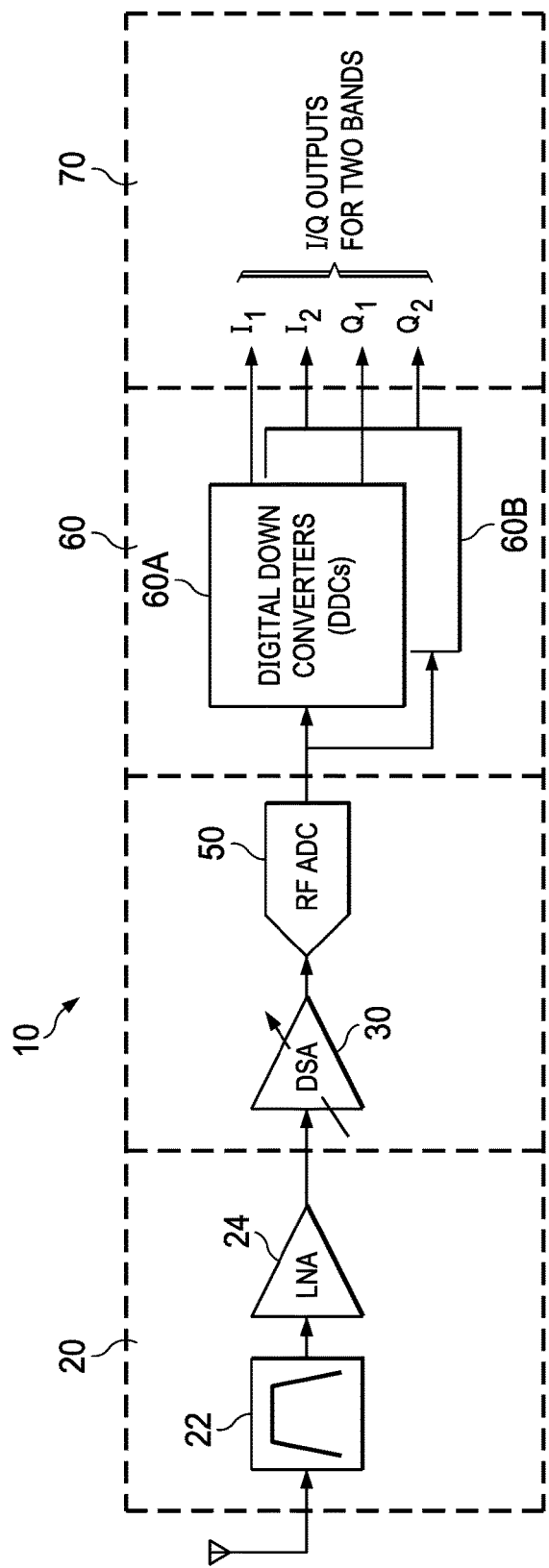
FIGS. 1A-1B illustrate an example RF receiver architecture 10.

This Description and the Drawings constitute a Disclosure for digital filtering for frequency-dependent errors in phase and/or gain (phase/gain) of an analog signal, using a parameterized filter with a complex filter parameter, including describing design examples (example implementations), and illustrating various technical features and advantages.

The Disclosure for digital filtering for frequency-dependent errors in phase/gain using a parameterized filter is described in connection with an example application for digital step attenuation with correction for frequency-dependent DSA gain and/or phase (gain/phase) errors based on digital filtering with a parameterized filter configurable with at least one complex filter parameter for each DSA attenuation step, such as can be used in an RF transmitter and/or receiver, with the parameterized filter integrated into the digital signal chain.

As used in the Disclosure, DSA gain error (or DSA step gain error) is defined as a difference between actual step gain and expected step gain for each DSA attenuation step. For example if expected step gain is 10 dB and the actual step gain is 9.6 dB, then the gain error is −0.4 dB. DSA phase error (or DSA step phase error) is the change in signal phase at the DSA output across DSA attenuation steps when DSA attenuation is changed. Ideally, for a step change in DSA attenuation, only a change in attenuation (step gain) is expected but no change in output signal phase, so that any change in signal phase is the DSA phase error.

In brief overview, digital step attenuation with correction for frequency-dependent DSA gain/phase errors using a parameterized filter configurable with at least one complex filter parameter for each DSA attenuation step, according to the disclosure, can be implemented in an RF receiver architecture including a DSA in the analog signal chain providing input to an ADC (for example, an RF ADC), with the parameterized filter included in the digital signal chain (for example, within a DDC decimation filter chain). The DSA is configured to attenuate the RF RX signal with DSA attenuation steps, selected based on a DSA control signal (such as a DSA control word), and generate a DSA output that includes DSA phase/gain errors. The ADC is configured to convert an input signal corresponding to the DSA output to a digital ADC output provided to the digital signal path, and downconverter circuitry included in at least one of the analog signal path and the digital signal path, and configured to downconvert a signal at the RF frequency to a signal at a baseband frequency.

According to aspects of the Disclosure, a DSA frequency-dependent corrector filter is included in the digital signal path, and configured as a parameterized filter with at least one filter tap, the parameterized filter configurable based on the DSA control signal with at least one complex filter parameter for each DSA attenuation step, to correct frequency-dependent errors in phase and/or gain.

According to other aspects of the Disclosure, the parameterized filter has a filter response in the frequency domain that is linear across frequency, and the at least one complex filter parameter has a real part determining a slope of the linear phase change response of the parameterized filter over the target frequency band to correct the frequency-dependent DSA phase error (phase error across DSA attenuation steps), and an imaginary part determining a slope of the linear gain change response of the parameterized filter over the target frequency band to correct the frequency-dependent DSA gain step error (gain error for the DSA attenuation step).

According to other aspects of the Disclosure, DSA frequency-independent corrector circuitry is included in the digital signal path, and for each DSA attenuation step, is configured, based on the DSA control signal, to correct frequency-independent DSA errors in phase and gain that are independent of frequency, the DSA frequency-independent corrector circuitry including: (a) frequency-independent phase correction circuitry responsive to the DSA control signal to introduce a DSA phase correction to correct for the frequency-independent DSA phase errors; and (b) frequency-independent gain correction circuitry responsive to the DSA control signal to introduce frequency-independent gain correction to correct for the frequency-independent gain errors.

FIG. 1A illustrates an example RX signal chain 10, including an analog signal chain with RX input amplification 20, DSA 30 and RF ADC 50, and a digital signal chain with DDC (digital down converter) 60. The example RX RF architecture provides dual band IQ outputs 70.

Figure 1B:
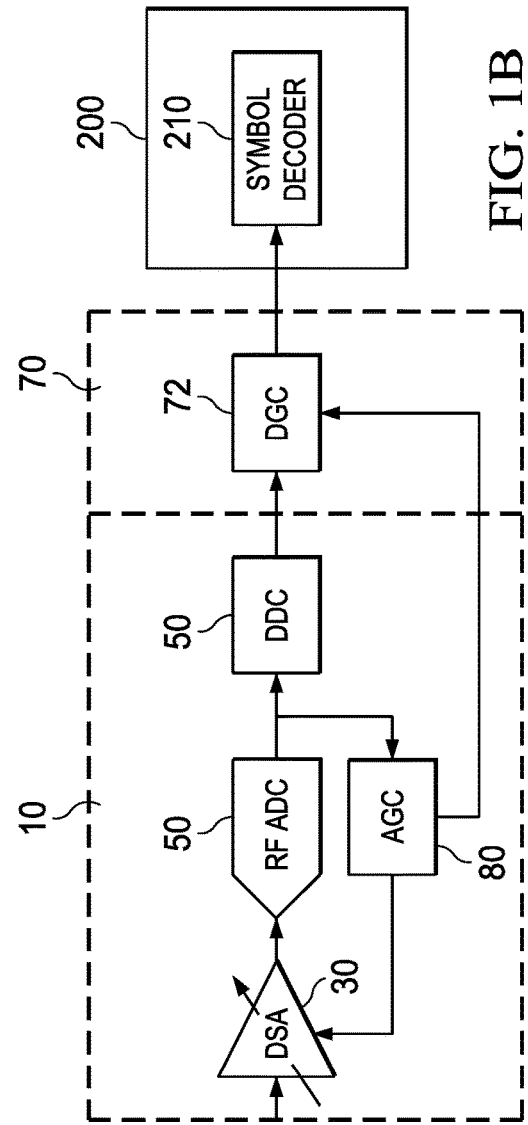

FIG. 1B illustrates the example RX signal chain 10 of FIG. 1A, including additional functional blocks for AGC (automatic gain control) 80 and DGC (digital gain compensation) 72. The dual band I/Q digital baseband data is output, for example, to a baseband processor 200, including a symbol decoder 210.

AGC 80 implements an AGC algorithm to generate a DSA control word (signal) for controlling (selecting) DSA step attenuation. After downconversion to digital baseband, DGC 72 compensates for DSA gain, outputting the I/Q digital baseband data at a nominal gain for input to the symbol decoder (i.e., independent of DSA gain).

Figure 2:
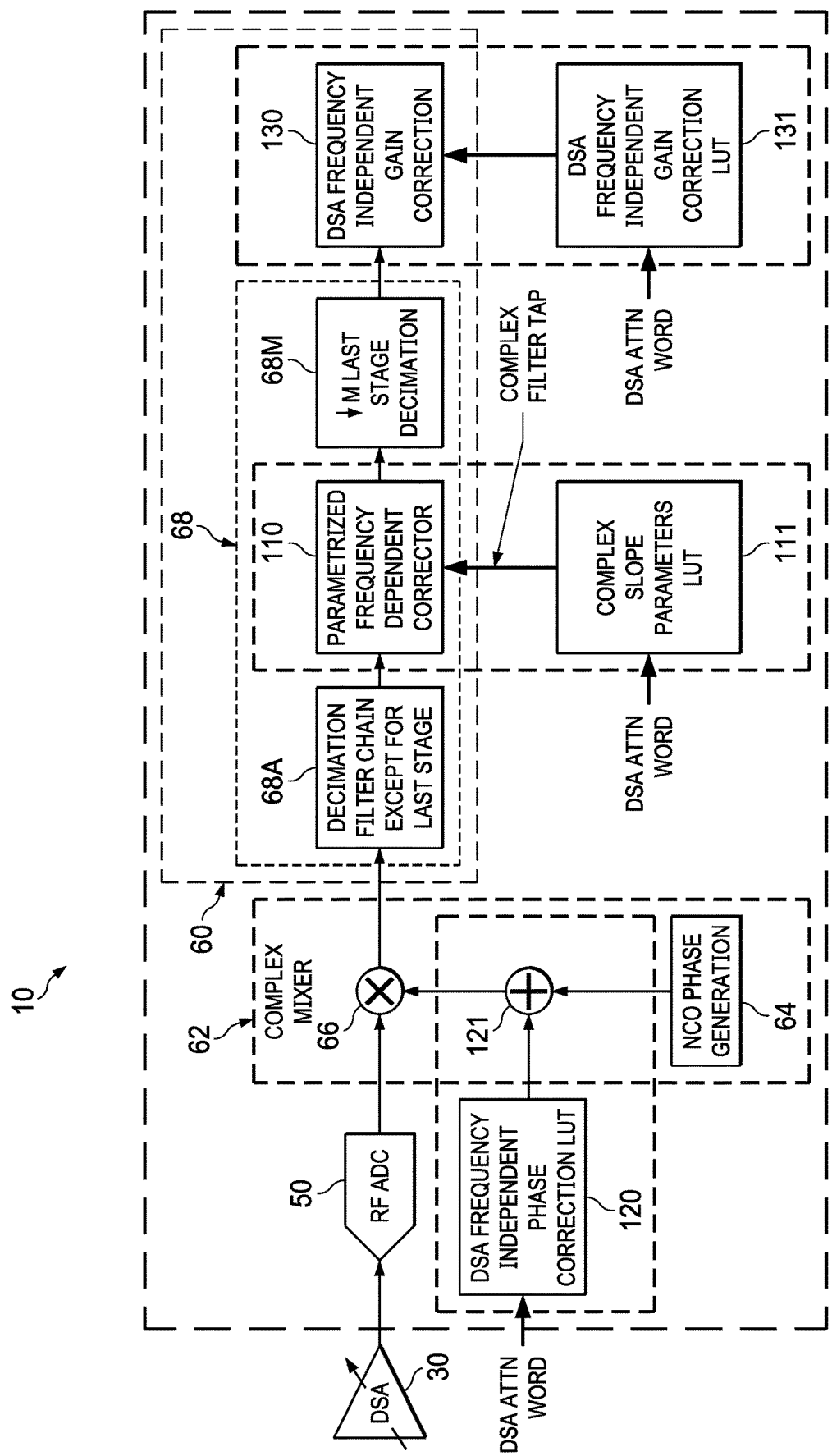
FIG. 2 illustrates an example RF-to-BB signal chain based on the RF ADC architecture of FIGS. 1A/1B, including digital step attenuation with correction for frequency-dependent DSA gain/phase errors, using a parameterized filter with complex filter parameters according to the Disclosure, including a DSA 30, RF ADC 50, and DDC 60, the DDC 60 including a complex NCO downconverter 62 (64/66) and a decimation filter chain 68 (multistage 68A/68M), and including, according to aspects of the disclosure: (a) an example DSA frequency-dependent corrector 101 with a parameterized filter configurable, for each DSA attenuation step, with an associated complex filter parameter 110 (from LUT 111), and (b) example DSA frequency-independent corrector circuitry with frequency-independent phase correction circuitry 120/21, and frequency-independent gain correction circuitry 130/131.

FIG. 2 illustrates an example RX signal chain 10 based on the example RF ADC architecture of FIGS. 1A/1B, including digital step attenuation with correction for frequency-dependent gain/phase errors in DSA step attenuation using a parameterized filter with complex filter parameters according to the Disclosure. The example RX signal chain 10 includes in the analog signal chain a DSA 30 to provide digital step attenuation of an input RF RX signal. The step attenuated DSA output is generated with phase and gain errors, such as from phase and gain mismatches of the DSA circuitry, including phase and gain errors that vary with frequency in the target frequency band.

Example RF-to-BB conversion 40 is implemented with an RF ADC 50 and example DDC 60. As selected by a DSA control signal (such as from and AGC as in FIG. 1B), DSA 30 step attenuates the input RF RX signal for input to RF ADC 50 (within the specified input range).

Example DDC 60 includes in the digital signal chain, an example NCO driven downconverter 46, and an example multi-stage decimation filter 48. The example NCO driven downconverter 62 includes a complex mixer 66 and an NCO 64 that provides a programmable time-varying NCO phase signal. The example multi-stage decimation filter is represented by an initial decimation stage 68A, and a final decimation stage 68M.

The example RX signal chain 10 implements digital step attenuation with separate correction for frequency-dependent and frequency-independent gain/phase errors in DSA step attenuation, introducing at different points in the decimation filter chain: a parameterized linear frequency-dependent corrector 110/111, and frequency-independent phase corrector 120 and gain corrector 130/131, to correct for the DSA gain and phase mismatches.

Specifically, the RX signal chain includes: (a) for correcting frequency-dependent phase and gain errors, an example DSA frequency-dependent corrector 110/111 with a parameterized filter 110 configurable for each DSA attenuation step with an associated complex filter parameter, loaded from a programmable LUT 111 based on a DSA attenuation word, and (b) for correcting frequency-independent phase and gain errors, example DSA frequency-independent corrector circuitry with frequency-independent phase correction circuitry 120/121 (with a DSA attenuation word addressable LUT 120), and frequency-independent gain correction circuitry 130/131 (with a DSA attenuation word addressable LUT 131). The LUT's are programmable and are programmed with the measured DSA errors.

According to aspects of the Disclosure, the DSA frequency-dependent corrector filter 110/111 is included in the digital signal path. As implemented, the DSA frequency-dependent corrector filter 110/111 is incorporated into the decimation filter chain, before the final decimation stage. The DSA frequency-dependent corrector filter 110/111 is configured, for each DSA attenuation step as selected by the DSA control signal (control word), to correct frequency-dependent DSA errors in phase and gain that are dependent on baseband frequency.

The DSA frequency-dependent corrector filter is configured as a parameterized filter with multiple filter taps. In the example, the parameterized filter has a filter response in the frequency domain that is linear across the target frequency band. The example parameterized filter can be controlled by a single complex filter parameter, selectable based on the DSA control signal, and applied to at least some of the filter taps. The parameterized filter is linear in phase (degree) and in magnitude (dB), with the complex filter parameter effectively providing linear slope control for the filter response. Each complex filter parameter (for each DSA attenuation step selected by a DSA attenuation word) has a real part determining a slope of the linear phase change response of the parameterized filter over the target frequency band to correct the frequency-dependent DSA phase error, and an imaginary part determining a slope of the linear gain change response of the parameterized filter over the target frequency band to correct the frequency-dependent DSA gain error.

Figure 4A:
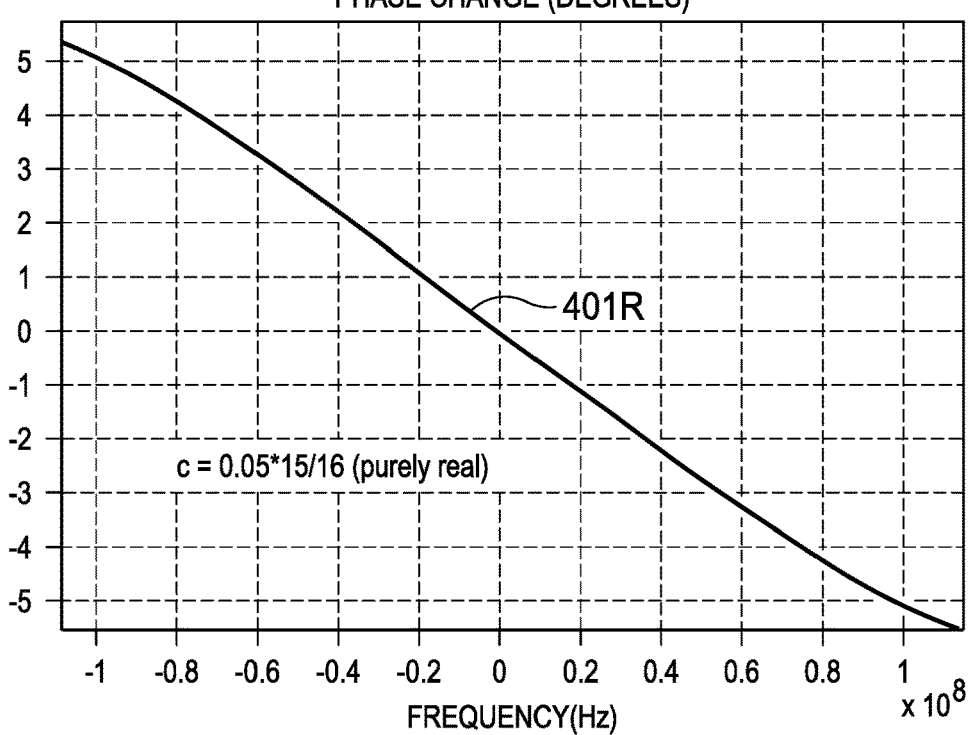
FIGS. 4A-4B are example plots illustrating the linear phase change (4A) and gain change (4B) for a parameterized filter with a single complex filter parameter, having a real part determining a slope of the linear phase change response 401R of the parameterized filter over the target frequency band to correct the frequency-dependent DSA phase error, and an imaginary part determining a slope of the linear gain change response 401I of the parameterized filter over the target frequency band to correct the frequency-dependent DSA gain error.

That is, as described further in connection with FIGS. 4A/4B, the parameterized filter, and associated complex filter parameter, are configured so that the phase and gain change response of the parameterized filter is linear over a pre-defined target frequency range, for example, 80% of the output frequency band, and is therefore linear (within a predefined linearity specification) within the target frequency band.

For the example implementation, the parameterized filter 110 is introduced before the final decimation stage to provides an optimal balance between the number of filter taps and the clock rate. However, this is a design choice, and the parameterized filter 110 can be incorporated at any point in the digital signal path, for example at the end of the decimation filter chain, although this location will increase the number or filter taps. To reduce the number of filter taps, the ADC oversampling ration (OSR) can be increased to provide a larger transition region and lower number of taps According to other aspects of the Disclosure, the DSA frequency-independent corrector circuitry for phase 120/121 and gain 130/131 mismatch correction is included in the digital signal path, as implemented, at the input (120121) and the output (130/131) of the decimation filter chain. The DSA frequency-independent corrector circuitry is configured, for each DSA attenuation step as selected by the DSA control signal (control word), to correct frequency-independent DSA errors in phase and gain that are independent of frequency. Specifically, the DSA frequency-independent corrector circuitry includes: (a) frequency-independent phase correction circuitry 120/121 responsive to the DSA control signal to introduce a DSA phase correction summed 121 with the NCO phase signal 64 to correct for the frequency-independent DSA phase errors; and (b) frequency-independent gain correction circuitry 130/131 responsive to the DSA control signal to introduce frequency-independent gain correction to correct for the frequency-independent gain errors.

For the example implementation in which the RX signal chain includes a DDC 68 with an NCO driven downconverter 62, the example implementation for the phase correction circuitry takes advantage of the NCO to introduce the DSA phase correction 120 by summing 121 with the NCO phase signal 64, performing phase correction along with the NCO driven digital downconversion (as part of RF-to-baseband conversion). Alternately, the DSA phase correction can be introduced elsewhere in the digital signal path, for example at the end of the decimation filter chain.

The frequency-independent DSA gain correction circuitry 130/131 can be implemented as a multiplier. For the example implementation, the gain correction circuitry is introduced at the end of the decimation filter chain (lowest frequency).

Figure 3A:
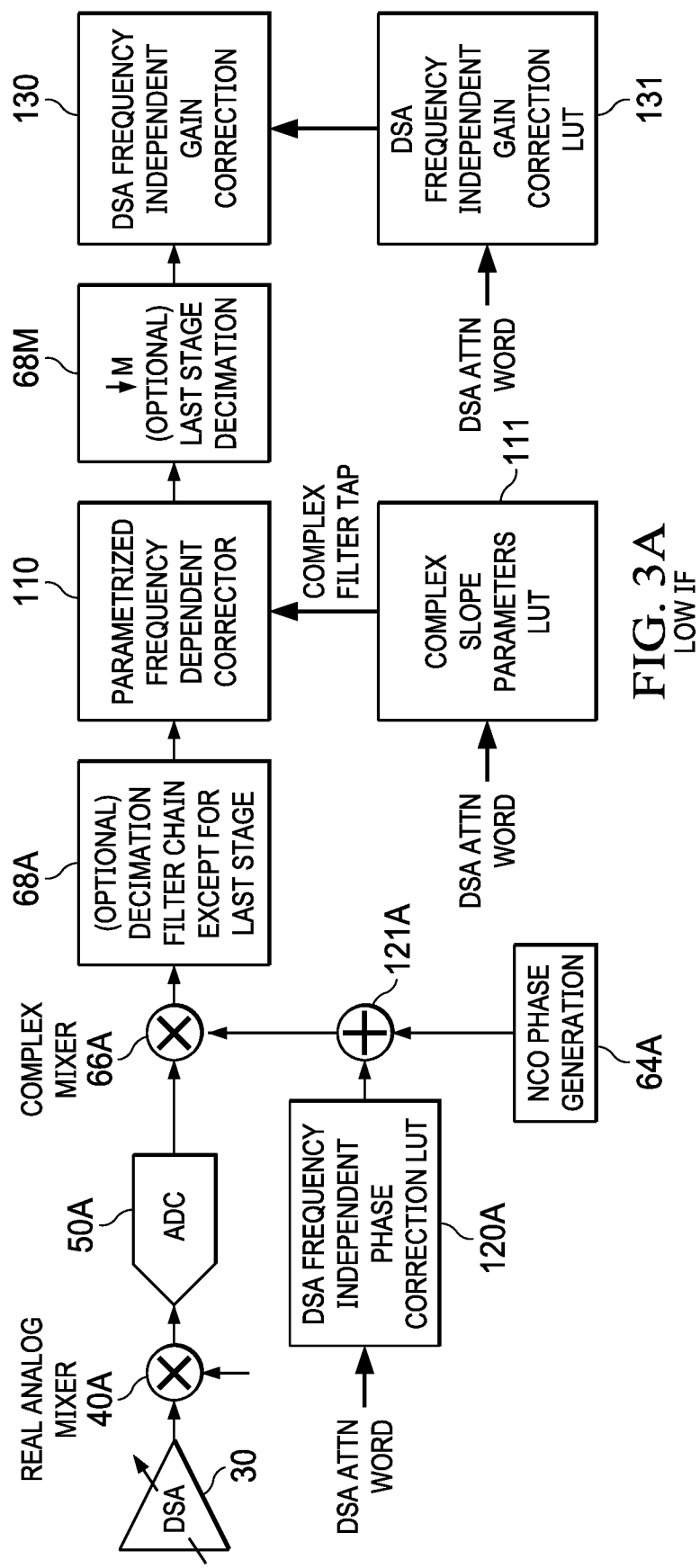
FIGS. 3A and 3B illustrate alternate example configurations for RF-to-BB signal chains that do not use an RF ADC, including DSA correction for frequency-dependent DSA gain/phase errors using a parameterized filter with complex filter parameters according to the Disclosure, as described in connection with FIG. 3.
Figure 3B:
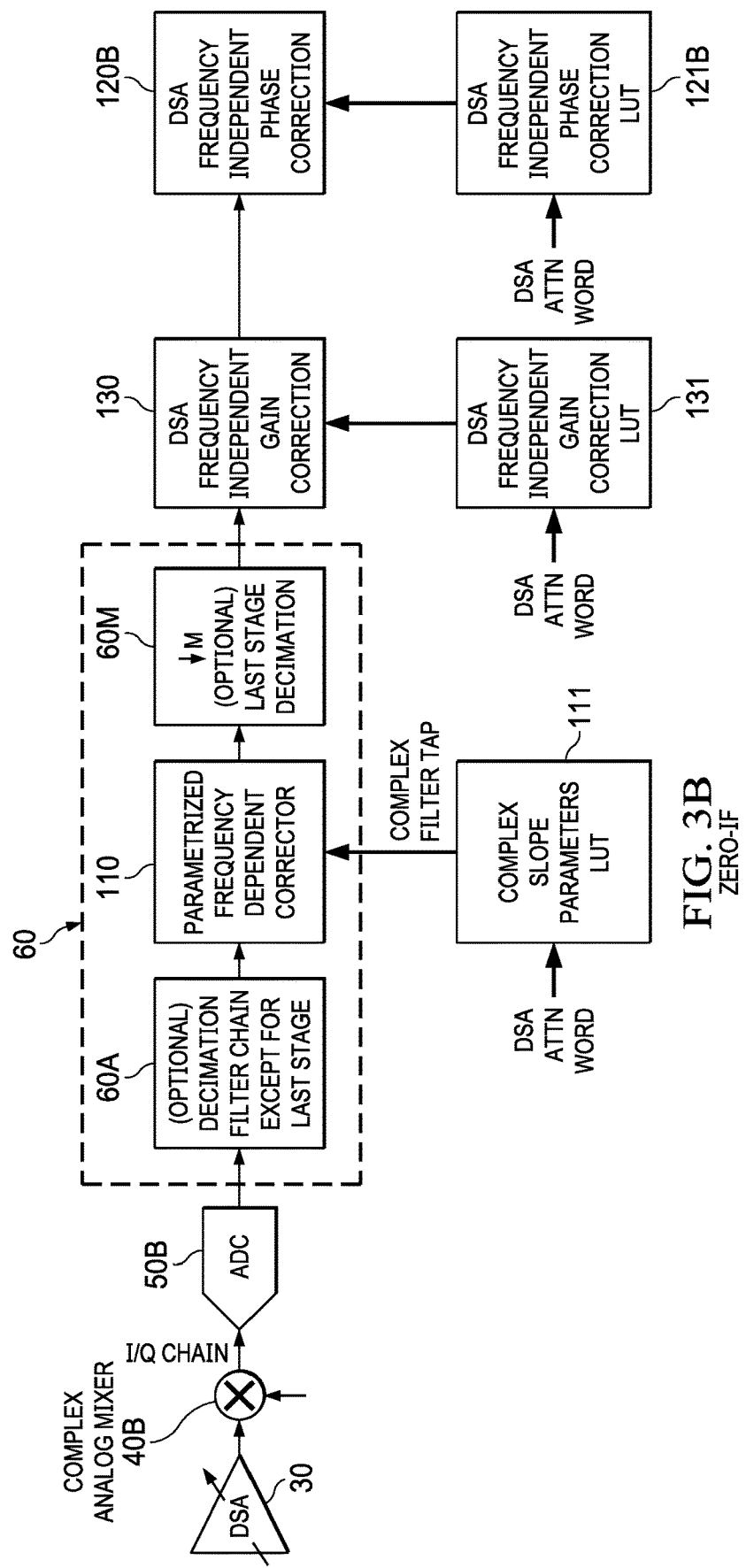

FIGS. 3A and 3B illustrate alternate example RF-to-BB signal chains configured for digital step attenuation with correction for frequency-dependent DSA gain/phase errors using a parameterized filter with complex filter parameters according to the Disclosure.

FIG. 3A illustrates a low-intermediate frequency (Low-IF) architecture in which the RF ADC of FIG. 2 is replaced with an ADC 50A and a real analog mixer 40A. In the analog signal chain, DSA 30 generates a DSA RF signal. The real analog mixer 40A downconverts the DSA RF signal to the input range of the ADC.

The digital signal chain is functionally identical to the digital signal chain in FIG. 2. Digital filtering is integrated into the digital signal chain to correct DSA gain/phase errors, including:

A DSA frequency-dependent corrector 110/111 to correct DSA frequency-dependent errors in phase/gain. The DSA frequency-dependent corrector includes a parameterized filter 110 that is incorporated into the DDC filter chain, prior to the last decimation filter 68M, as in the example of FIG. 2.

DSA frequency-independent corrector circuitry 120/121 and 130/131 to correct DSA frequency-independent errors in phase/gain. The DSA frequency-independent corrector circuitry is implemented as in FIG. 2, with (a) frequency-independent phase correction circuitry 120/121 to introduce a DSA phase correction summed with the NCO phase signal to correct for the frequency-independent DSA phase errors; and (b) frequency-independent gain correction circuitry 130/131 to introduce frequency-independent gain correction to correct for the frequency-independent gain errors.

FIG. 3B illustrates a zero-intermediate frequency (Zero-IF) architecture in which the RF ADC is replaced with an ADC 50B preceded by a complex analog mixer 40B do downconvert the DSA RF signal, including digital filtering to correct DSA gain/phase errors.

For Zero-If, downconversion from RF-to-BB, after DSA attenuation, is performed by a complex analog mixer 40B. The ADC 50B provides conversion, but commonly with oversampling for noise shaping, followed by decimation 60 (60A/60M) in the digital signal path.

For the illustrated example, the DDC includes a decimation filter chain, but unlike the example in FIG. 2, does not include a complex NCO downconverter. The DSA frequency-dependent corrector 110/111 includes a parameterized filter 110 incorporated into the DDC filter chain, prior to the last decimation filter 60M, as in the example in FIG. 2. The DSA frequency-independent corrector circuitry is included in the digital signal chain, after the DDC: (a) frequency-independent phase correction circuitry 120B/121B to introduce a DSA phase correction to correct for the frequency-independent DSA phase errors, and (b) frequency-independent gain correction circuitry 130B/131B to introduce frequency-independent gain correction to correct for the frequency-independent gain errors.

Alternate RF RX architectures/implementations that do not require an RF ADC, and/or illustrate alternate downconversion implementations, are design examples, and do not indicate design requirements or constraints for implementing designs including digital step attenuation with correction for frequency-dependent gain/phase errors in DSA step attenuation using a parameterized filter with complex filter parameters, according to the Disclosure.

Digital filtering for frequency-dependent errors in phase/gain using a parameterized filter is described in connection with an example application for digital step attenuation with correction for frequency-dependent DSA gain and/or phase (gain/phase) errors based on digital filtering with a parameterized filter configurable with at least one complex filter parameter for each DSA attenuation step, can also be implemented in an RF transmitter to provide pre-compensation for DSA gain/phase errors that would otherwise be input to the TX power amplifier. The digital filtering for DSA gain/phase errors can be incorporated into the digital signal chain prior to the DAC providing RF analog to the TX DSA.

Figure 4B:
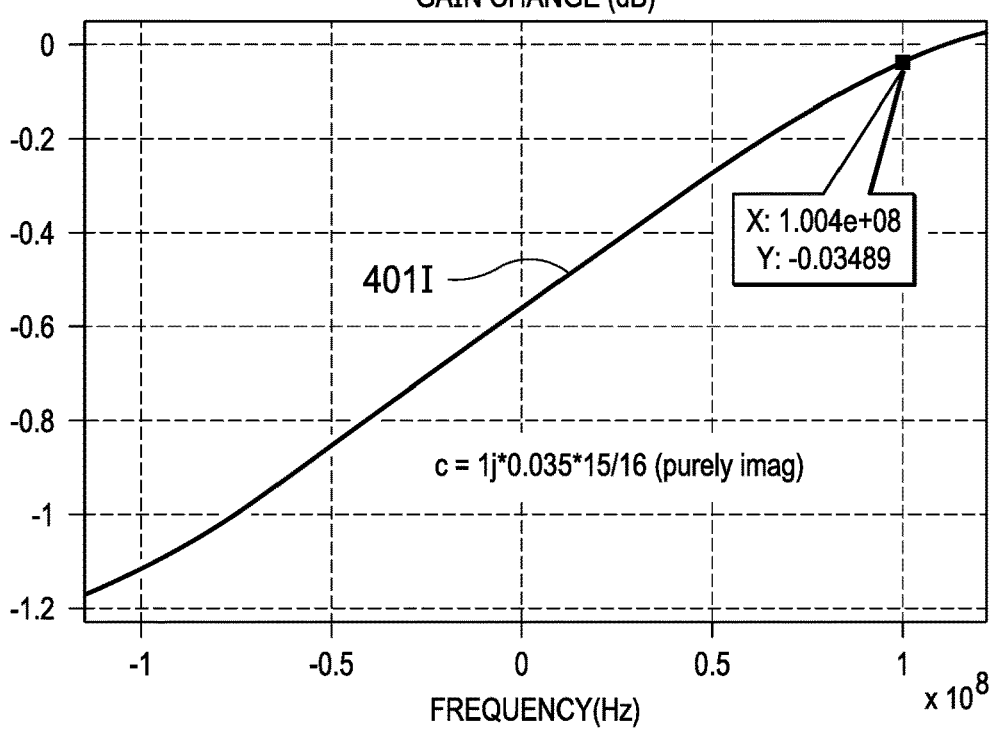

FIGS. 4A and 4B are example plots illustrating the linear phase change and gain change for a parameterized filter with a single complex filter parameter "C". The complex filter parameter has a real part determining a slope of the linear phase change 401R response of the parameterized filter over a pre-defined frequency range within the target frequency band to correct the frequency-dependent DSA phase error, and an imaginary part determining a slope of the linear gain change 401I response of the parameterized filter over a pre-defined frequency range within the target frequency band to correct the frequency-dependent DSA gain error.

An example 5 tap parameterized filter, with a last stage decimation of 2 is $$\left[ \frac{C}{8},\ -C,\ \frac{15}{16},\ C,\ -\frac{C}{8} \right]$$

Let this 5 tap filter be denoted as h(k) with k ranging from −2 to 2. If x(n) & y(n) denote the complex baseband input and output respectively then the standard discrete time filter equation is written as $$y(n) = \sum_{k=-2}^{2} x(n-k) h(k)$$

The example 5 tap parameterized filter is controlled by the single complex parameter "C", requiring a single complex multiplication by "C", and the LUT storage of a single complex parameter for each DSA attenuation step (DSA attenuation word), which can be determined in a two tone calibration operation such as described in connection with FIGS. 5A-5C. The real part of the complex parameter "C" controls slope of linear phase change 401R, and the imaginary part of the complex parameter "C" controls slope of the linear (dB) gain change 401I.

Note that for this design example with a 5 tap parameterized filter and a single complex parameter "C", the filter is linear for approximately 80% of the output frequency band, which is the pre-defined target frequency bandwidth. For alternate filter designs in which filter response is not a linear change across frequency, multiple complex parameters can be used to model the frequency response of the filter.

The general form of the filter is sum of a fixed center tap and a scaled derivative filter term. In the following description of the filter, h'(k) denotes a derivative or difference filter whose number of taps and tap coefficients are normally derived based on the exact specifications like percentage band-width support and accuracy.

$$h(k) = \begin{cases} C * h'(k) & \text{for } k \neq 0 \\ C * h'(0) + \text{CenterTap} & \text{for } k = 0 \end{cases}$$

In the earlier example described in [0030], CenterTap is 15/16 and derivative filter is 5 Tap filter extending from −2 to 2.

$$h'(-2)=\tfrac{1}{8}, h'(-1)=-1, h'(0)=0, h'(1)=1, h'(2)=-\tfrac{1}{8}$$

FIGS. 5A-5C are example plots illustrating an example calibration operation for determining, for each DSA attenuation step:

for the DSA frequency-dependent corrector 510, a complex filter parameter for the parameterized filter based on responses of the DSA to two tone signals in the target frequency band (FIG. 5A), with a slope of the DSA responses equated to a slope of the linear phase change of the parameterized filter over a pre-defined frequency range, and to a slope of the linear gain change of the parameterized filter over the pre-defined frequency range; and for the DSA frequency-independent corrector circuitry 520/530, the DSA phase correction (FIG. 5B) to correct frequency-independent DSA phase errors, and the DSA gain correction (FIG. 5C) to correct frequency-independent DSA gain errors, are estimated based on averages of frequency-independent DSA phase error and frequency-independent DSA gain error remaining after the DSA frequency-dependent corrector filter has corrected frequency-dependent phase and gain errors.

That is, to estimate the frequency-dependent and frequency-independent mismatches, the calibration model is as follows.

FIG. 5A illustrates an example for mismatch to be corrected (with respect to a reference DSA setting) for 10 dB attenuation. The slope of the DSA response (in the target frequency band) to the two tone signals is equated to the negative of the slope of the linear gain response (in dB) and linear phase response (in degrees) of the frequency-dependent parameterized filter 510, which determines the complex parameters of the parameterized filter (i.e., the DSA frequency-dependent corrector). The two tone signals are required for the slopes of the phase and gain (magnitude) response of DSA. For optimal estimation of the complex filter parameters, the two tones should be near the edges of the target frequency band.

FIGS. 5B/5C illustrate that, after the DSA frequency-dependent corrector 510 has corrected for frequency-dependent phase and gain errors, the remaining phase and gain errors (with respect to a reference) for the DSA response to the two tones will be equal. And, the remaining error in phase and gain is frequency-independent, and can be estimated by taking the average of the DSA response errors.

Figure 6A:
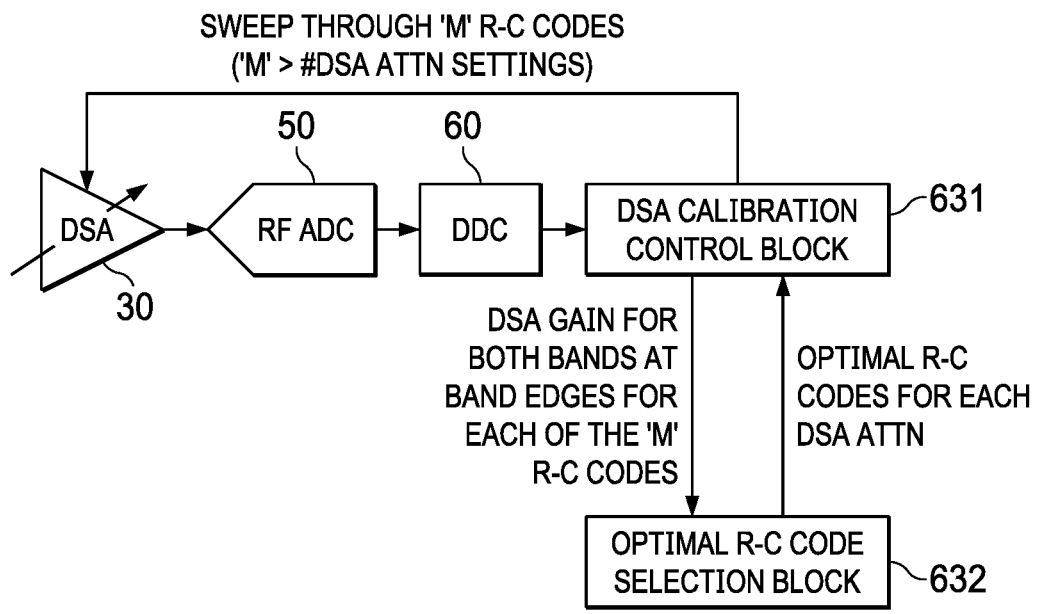
FIGS. 6A and 6B illustrate an example calibration methodology for selecting DSA step attenuation codes (DSA RC codes) based on a weighted RC code selection criteria 631/632.
Figure 6B:
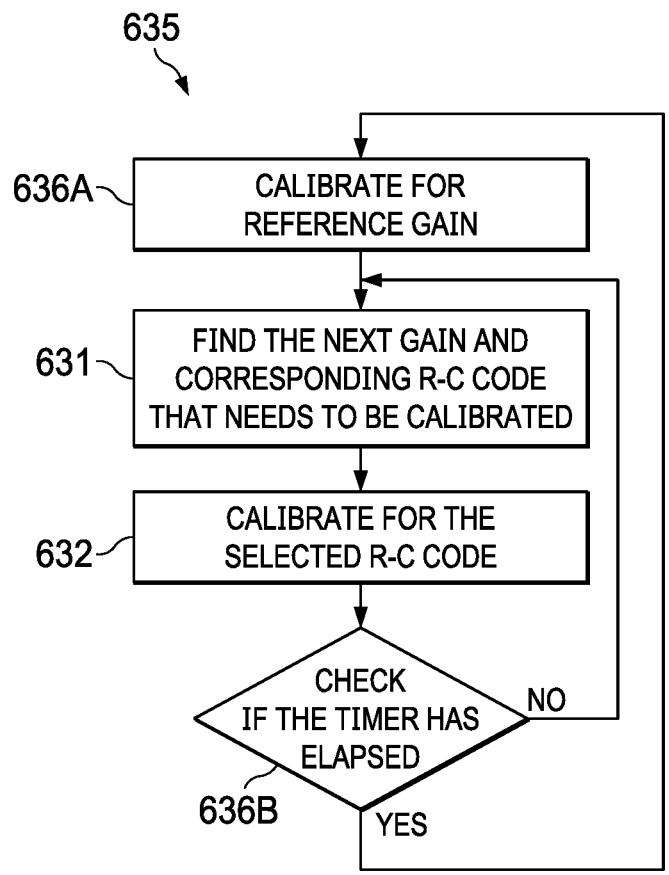

FIGS. 6A and 6B illustrate an example calibration methodology for selecting DSA step attenuation codes (DSA RC codes) based on a weighted RC code selection criteria.

FIG. 6A illustrates an example calibration configuration for DSA RC code selection, including 631/632. Weighted optimal RC code selection criteria are used to optimize 632 for gaining in the DSA correctors (frequency-independent and frequency dependent), rather than attenuation, to avoid ADC saturation.

In the normal power up mode of the device, the DSA 30 is configured for 'N' (for example, 25) R-C codes corresponding to 'N' DSA attenuation steps/settings. The residual gain errors after programming these R-C codes is corrected by in digital by the DSA correctors (frequency dependent and independent).

The gain variation across frequency bands and process corners can be high, which would require a large digital correction (for example, in the range of 2 dB), either attenuation or gain. For example, some RF ADC architectures support dual band, and hence use two DDCs after the RF-sampling ADC to decimate and output two bands. And RF sampling architectures need to support frequency bands starting from 800 MHz to as high as 3.5 GHz. A large digital attenuation correction can lead to saturation of the signal at the ADC input, while a large digital gain correction can lead to SNR loss.

The example calibration methodology for DSA RC code selection uses an RC search algorithm, in which calibration is for N DSA RC codes is selected from 'M' possible DSA attenuation RC codes (M>N), covering a nominal attenuation range of 'N+δ' dB. Covering a nominal attenuation range of 'N+δ' dB ensures that the range of 'N' dB is covered across bands and process corners.

The optimal RC code selection block 632 then selects the 'N' optimal among the 'M' RC codes for the 'N' DSA attenuation settings. The optimal RC code selection block 632 receives the maximum gain error to be corrected across both bands for each RC code, for each DSA attenuation setting, and selects for each DSA attenuation setting the RC code that has the minimum error among the maximum gain errors.

In addition, the DSA RC code selection methodology can be configured for a weighted optimal RC code selection criteria 632 in which preference is for DSA RC codes that require gaining in the digital DSA correctors, instead of attenuation, thereby reducing the chance of ADC saturation. Typically saturation at the ADC less acceptable than SNR loss.

FIG. 6B illustrates an example calibration methodology 635 in which the reference used in the calibration configuration of FIG. 6A is periodically calibrated 636A/636B (for example, back to 0 dB) during DSA RC code calibration.

The signal source used for DSA RC code calibration can have a slow source wander, particularly in phase. For DSA gain step errors that are specified with respect to a reference (0 dB), source wander can lead to inaccuracies in the estimation of the gain/phase errors. That is, source wander cam produce gain/phase errors that affect the accurate estimation of gain/phase errors required for calibrating the complex filter parameters.

The example calibration methodology, can include a periodic reference calibration routine 635 in which the reference is measured periodically 636A/636B, and normalized to a reference value (for example, 0 dB) 636A, and used to calculate all the gain step errors with respect to the re-calibrated reference 631/632. Specifically, because the source wander is slow, the phase/gain change will be insignificant compared to the specification required for a time ($\tau$), so that the reference is periodically measured with time period of ($\tau$). Because all the DSA gain step errors are with respect to the reference, the error on the frequency-dependent and frequency-independent parameters can be calibrated lower than the specification.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit for use in a system for radio frequency (RF) communication including a transmit (TX) end, and a receive (RX) end to receive an RF RX signal at an RF frequency within a target frequency band, the circuit comprising:
   an input port to receive the RF RX signal;
   an analog-to-digital converter (ADC) with an input coupled through an analog signal path to the input port, and with an output coupled through a digital signal path to an output port;
   a digital step attenuator (DSA) coupled to the analog signal path, and configured to attenuate the RF RX signal with selectable DSA attenuation steps based on a DSA control signal, and generate a DSA output that includes, for at least some of the DSA attenuation steps, DSA phase errors and/or DSA gain errors;
   the ADC configured to convert an input signal corresponding to the DSA output to a digital ADC output provided to the digital signal path;

downconverter circuitry included in at least one of the analog signal path and the digital signal path, and configured to downconvert a signal at the RF frequency to a signal at a baseband frequency;

a DSA frequency-dependent corrector filter included in the digital signal path, and configured as a parameterized filter, the parameterized filter configurable based on the DSA control signal with a complex filter parameter for each DSA attenuation step, to correct frequency-dependent errors in phase and/or gain.

2. The circuit of claim 1, wherein:

the parameterized filter has a filter response in the frequency domain that is linear across frequency; and the complex filter parameter having a real part determining a slope of the linear phase change response of the parameterized filter over a pre-defined frequency range within the target frequency band to correct the frequency-dependent DSA phase error, and/or an imaginary part determining a slope of the linear gain change response of the parameterized filter over a pre-defined frequency range within the target frequency band to correct the frequency-dependent DSA gain error.

3. The circuit of claim 1, wherein the ADC is an RF ADC that converts the DSA output at the RF frequency to a digital RF signal.

4. The circuit of claim 1, further comprising a digital downconverter (DDC) in the digital signal path to downconvert the digital ADC output to the baseband frequency;

the DDC including a decimation filter with at least a final decimation stage;

the DSA frequency-dependent corrector filter included in the digital signal path in front of the final decimation stage.

5. The circuit of claim 1, wherein, for each DSA attenuation step, for a parameterized filter:

the complex filter parameter is determined in a calibration operation based on responses of the DSA to two tone signals in the target frequency band.

6. The circuit of claim 5, wherein the two tone signals are near the band edges for the target frequency band.

7. The circuit of claim 1, further comprising:

DSA frequency-independent corrector circuitry included in the digital signal path, and for each DSA attenuation step, configured, based on the DSA control signal, to correct frequency-independent DSA errors in phase and gain that are independent of frequency, the DSA frequency-independent corrector circuitry including frequency-independent phase correction circuitry responsive to the DSA control signal to introduce a DSA phase correction to correct for the frequency-independent DSA phase errors; and frequency-independent gain correction circuitry responsive to the DSA control signal to introduce frequency-independent gain correction to correct for the frequency-independent gain errors.

8. The circuit of claim 7, further comprising:

a digital downconverter (DDC) in the digital signal path to downconvert the digital ADC output to the baseband frequency, the DDC including:

a mixer coupled to the ADC, and a numerical controlled oscillator (NCO) to drive the mixer with an time-varying NCO phase signal, and a decimation filter chain coupled to the mixer;

the frequency-independent phase correction circuitry coupled to the NCO, and responsive to the DSA control signal to add a DSA phase correction to the NCO phase signal to correct frequency-independent DSA phase errors.

9. The circuit of claim 8, wherein the parameterized filter has a filter response in the frequency domain that is linear across frequency, and further comprising a calibration operation in which, for each DSA attenuation step:

for the DSA frequency-dependent corrector filter, the complex filter parameter for the parameterized filter is determined based on responses of the DSA to two tone signals in the target frequency band, with a slope of the DSA responses equated to the slope of the linear phase change of the parameterized filter, and the slope of the linear gain change of the parameterized filter, over the pre-defined frequency range, to correct frequency-dependent DSA phase and gain errors; and for the DSA frequency-independent corrector circuitry, the DSA phase correction to correct frequency-independent DSA phase errors, and the DSA gain correction to correct frequency-independent DSA gain errors, are estimated based on residual frequency-independent DSA phase error and frequency-independent DSA gain error remaining after the DSA frequency-dependent corrector filter has corrected frequency-dependent phase and gain errors.

10. The circuit of claim 9, wherein:

for each DSA attenuation step, the DSA control signal is a control word; and the associated complex filter parameter for the parameterized filter to correct frequency-dependent phase and gain errors is stored in a look-up-table, addressed by the DSA control word;

the associated frequency-independent DSA phase correction is stored in a look-up-table, addressed by the DSA control word; and the associated frequency-independent DSA gain correction is stored in a look-up-table, addressed by the DSA control signal.

11. The circuit of claim 1, wherein the DSA is integrated into the analog signal path.

12. A circuit for correcting frequency-dependent errors in a digital step attenuator (DSA), comprising:

analog circuitry to provide an analog signal in an analog signal path;

DSA circuitry configured to attenuate the analog signal with selectable DSA attenuation steps based on a DSA control signal, and generate a DSA output that includes, for at least some of the DSA attenuation steps, DSA phase errors and/or DSA gain errors;

an analog-to-digital converter (ADC) to convert the analog signal to a digital signal output to a digital signal path;

the ADC configured to convert an input signal corresponding to the DSA output to a digital ADC output provided to the digital signal path;

a DSA frequency-dependent corrector filter included in the digital signal path, and configured as a parameterized filter, the parameterized filter configurable based on the DSA control signal with a complex filter parameter for each DSA attenuation step, to correct frequency-dependent errors in phase and/or gain.

13. The circuit of claim 12, wherein:

the parameterized filter has a filter response in the frequency domain that is linear across frequency; and the complex filter parameter having a real part determining a slope of the linear phase change response of the parameterized filter over a pre-defined frequency range within the target frequency band to correct the frequency-dependent DSA phase error, and/or an imaginary part determining a slope of the linear gain change response of the parameterized filter over a pre-defined frequency range within the target frequency band to correct the frequency-dependent DSA gain error.

14. The circuit of claim 12 wherein, for each DSA attenuation step, for a parameterized filter:
the complex filter parameter is determined in a calibration operation based on responses of the DSA circuitry to two tone signals in the target frequency band.

15. The circuit of claim 14, wherein the two tone signals are near the band edges for the target frequency band.

16. The circuit of claim 12, further comprising:
DSA frequency-independent corrector circuitry included in the digital signal path, and for each DSA attenuation step, configured, based on the DSA control signal, to correct frequency-independent DSA errors in phase and gain that are independent of frequency, the DSA frequency-independent corrector circuitry including
frequency-independent phase correction circuitry responsive to the DSA control signal to introduce a DSA phase correction to correct for the frequency-independent DSA phase errors; and
frequency-independent gain correction circuitry responsive to the DSA control signal to introduce frequency-independent gain correction to correct for the frequency-independent gain errors.

17. The circuit of claim 16, wherein the parameterized filter has a filter response in the frequency domain that is linear across frequency, and further comprising a calibration operation in which, for each DSA attenuation step:
for the DSA frequency-dependent corrector filter, the complex filter parameter for the parameterized filter is determined based on responses of the DSA circuitry to two tone signals in the target frequency band, with a slope of the DSA responses equated to the slope of the linear phase change of the parameterized filter, and the slope of the linear gain change of the parameterized filter, over the pre-defined frequency range, to correct frequency-dependent DSA phase and gain errors; and
for the DSA frequency-independent corrector circuitry, the DSA phase correction to correct frequency-independent DSA phase errors, and the DSA gain correction to correct frequency-independent DSA gain errors, are estimated based on residual frequency-independent DSA phase error and frequency-independent DSA gain error remaining after the DSA frequency-dependent corrector filter has corrected frequency-dependent phase and gain errors.

18. The circuit of claim 17, wherein:
for each DSA attenuation step, the DSA control signal is a control word; and
the associated complex filter parameter for the parameterized filter to correct frequency-dependent phase and gain errors is stored in a look-up-table, addressed by the DSA control word;
the associated frequency-independent DSA phase correction is stored in a look-up-table, addressed by the DSA control word; and
the associated frequency-independent DSA gain correction is stored in a look-up-table, addressed by the DSA control signal.

19. The circuit of claim 12, wherein the DSA circuitry is integrated into the analog signal path.

20. A method for correcting frequency-dependent errors in a digital step attenuator (DSA), the DSA configured to attenuate an analog signal with selectable DSA attenuation steps based on a DSA control signal, and generate a DSA output that includes, for at least some of the DSA attenuation steps, DSA phase errors and/or DSA gain errors, comprising:
converting with an analog to digital converter (ADC) the analog signal to a digital signal output to a digital signal path; the ADC configured to convert an input signal corresponding to the DSA output to a digital ADC output provided to the digital signal path;
in the digital signal path, filtering the ADC output with a DSA frequency-dependent corrector filter configured as a parameterized filter; and
configuring the parameterized filter based on the DSA control signal with a complex filter parameter for each DSA attenuation step, to correct frequency-dependent errors in phase and/or gain.

* * * * *